United States Patent
Vail et al.

(10) Patent No.: US 8,685,779 B1
(45) Date of Patent: Apr. 1, 2014

(54) GROUP VA-DOPED SOLUTION-PROCESSED METAL CHALCOGENIDES

(71) Applicant: Sharp Laboratories of America, Inc., Camas, WA (US)

(72) Inventors: Sean Vail, Vancouver, WA (US); Alexey Koposov, Vancouver, WA (US); Gary Foley, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/778,692

(22) Filed: Feb. 27, 2013

Related U.S. Application Data

(63) Continuation-in-part of application No. 13/733,283, filed on Feb. 21, 2013, which is a continuation-in-part of application No. 13/719,052, filed on Dec. 18, 2012, which is a continuation-in-part of application No. 13/711,356, filed on Dec. 11, 2012, which is a continuation-in-part of application No. 13/674,005, filed on Nov. 10, 2012.

(51) Int. Cl.
*H01L 31/18* (2006.01)

(52) U.S. Cl.
USPC ............... 438/57; 438/86; 438/478; 438/95; 257/E21.464

(58) Field of Classification Search
USPC .............................................. 438/57–98, 478
See application file for complete search history.

(56) References Cited

U.S. PATENT DOCUMENTS

| | | |
|---|---|---|
| 8,134,150 B2 | 3/2012 | Mitzi et al. |
| 2009/0145482 A1 | 6/2009 | Mitzi et al. |
| 2009/0320916 A1 | 12/2009 | Yuan et al. |
| 2011/0206599 A1 | 8/2011 | Keszler et al. |
| 2012/0214293 A1 | 8/2012 | Aksu et al. |

OTHER PUBLICATIONS

D. B. Mitzi et al., "A High-Efficiency Solution-Deposited Thin-Film Photovoltaic Device", Advanced Materials 2008, 20, 3657-3662.
D. B. Mitzi et al,, "Hydrazine-Based Deposition Route for Device-Quality CIGS Films", Thin Solid Films 2009, 517, 2158-2162.
T. K. Todorov et al., "Solution-Processed Cu(In,Ga)(S,Se)2 Absorber Yieiding a 15.2% . . . ", Progress in Photoyoltaics:Research and Applications 2012, doi:10.1002/pip.1253.
W. Wang, Y-W. Su and C-H. Chang, "Inkjet Printed Chalcopyrite CuInxGa1-x Se2 Thin Film Solar Cells", Solar Energy Materials & Solar Cells 2011, 95, 2616-2620.

(Continued)

*Primary Examiner* — Savitr Mulpuri
(74) *Attorney, Agent, or Firm* — Law Office of Gerald Maliszewski; Gerald Maliszewski

(57) ABSTRACT

A method is provided for forming a Group VA-doped solution-processed metal chalcogenide. The method forms a first solution including a first material group, dissolved in solvent. A Group VA-containing material is added to the first solution. The Group VA-containing material may include arsenic (As), antimony (Sb), bismuth (Bi), or combinations thereof. The first solution is deposited on a conductive substrate, and a Group VA-doped first intermediate film is formed comprising metal precursors from corresponding members of the first material group. Thermal annealing is performed in an environment of selenium (Se), Se and hydrogen ($H_2$), hydrogen selenide ($H_2Se$), sulfur (S), S and $H_2$, hydrogen sulfide ($H_2S$), or combinations thereof. As a result, the metal precursors in the Group VA-doped first intermediate film are transformed, forming a Group VA-doped metal chalcogenide layer. In one aspect, an antimony-doped Cu—In—Ga—Se chalcogenide (CIGS) is formed.

12 Claims, 4 Drawing Sheets

(56) References Cited

OTHER PUBLICATIONS

W. Wang et al., "8.01% CuInGaSe2 Solar Cells Fabricated by Air-Stable Low-Cost Inks", Physical Chemistry Chemical Physics 2012, 14, 11154-11159.

M. Yuan et al., "Antimony Assisted Low-Temperature Processing of CuIn1-xGaxSe2-ySy Solar Cells", Thin Solid Films 2010, 519, 852-856.

M. Yuan et al., "Optimization of CIGS-Based PV Device Through Antimony Doping", Chemistry of Materials 2010, 22, 285-287.

Y. Yaisushiro et al., "Effects of Antimony Doping on Cu(In1-x,Gax)Se2 Thin Films and Solar Cells", Japanese Journal of Applied Physics 2012, 51, 10NC25-1 to 10NC25-4.

Sb (0 mol%)

Sb (0.29 mol%)

Sb (1.0 mol%)

GROUP VA-DOPED SOLUTION-PROCESSED METAL CHALCOGENIDES

RELATED APPLICATION

The application is a Continuation-in-Part of an application entitled, ALKALI METAL-DOPED SOLUTION-PROCESSED METAL CHALCOGENIDES, invented by Sean Vail et al., Ser. No. 13/773,283, filed on Feb. 21, 2013;

which is a Continuation-in-Part of an application entitled, SOLUTION-PROCESSED METAL SELENIDE SEMICONDUCTOR USING DEPOSITED SELENIUM FILM, invented by Sean Vail et al., Ser. No. 13/719,052, filed on Dec. 18, 2012;

which is a Continuation-in-Part of an application entitled, ELECTROCHEMICAL SYNTHESIS OF SELENIUM NANOPARTICLES, invented by Wei Pan et al., Ser. No. 13/711,356, filed on Dec. 11, 2012;

which is a Continuation-in-Part of an application entitled, SOLUTION-PROCESSED METAL SELENIDE SEMICONDUCTOR USING SELENIUM NANOPARTICLES, invented by Sean Vail et al., Ser. No. 13/674,005, filed on Nov. 10, 2012. The above-mentioned applications are incorporated herein by reference.

BACKGROUND OF THE INVENTION

1. Field of the Invention

This invention generally relates to Group VA-doped metal chalcogenides and, more particularly, to processes for forming antimony-doped metal chalcogenides using solutions of metal precursors.

2. Description of the Related Art

Metal and mixed-metal chalcogenides represent important classes of semiconductor materials for electronic and photovoltaic (PV) applications. In particular, copper indium gallium diselenide ($CuIn_{1-x}Ga_xSe_2$ or CIGS) has emerged as a promising alternative to other existing thin-film technologies. Overall, CIGS exhibits a direct and tunable energy band gap, high optical absorption coefficient in the visible to near-infrared (NIR) spectrum and has demonstrated power conversion efficiencies (PCEs)>20%. Conventional CIGS fabrication (vacuum) processes typically involve either sequential or co-evaporation (or sputtering) of copper (Cu), indium (In), and gallium (Ga) metal onto a substrate followed by annealing in an atmosphere containing a selenium source to provide the final CIGS absorber layer.

In contrast to vacuum approaches, which create an environment to control variables such as the gases introduced and pressure, non-vacuum methods offer significant advantages in terms of both reduced cost and high throughput manufacturing capability. Electrodeposition or electroplating of metals (from metals dissolved in solution) onto conductive substrates represents an alternative CIGS fabrication strategy. Finally, CIGS fabrication via deposition of mixed binary, ternary, and/or quaternary nanoparticles of copper, indium, gallium, and selenium (nanoparticle "inks") embodies another non-vacuum approach.

In addition to the approaches described above, a number of alternative approaches and hybrid strategies have been reported with varying degrees of success. Overall, CIGS fabrication via solution-based approaches appears to offer a convenient, low-cost option. According to this method, metal salts or metal complexes (precursors) of copper, indium, and gallium are dissolved in a solvent to form a CIGS ink and subsequently deposited on a substrate to form a film using conventional methods.

Mitzi et al. described a solution-based CIGS absorber layer deposition strategy using homogenous solutions of Cu, In, Ga and Se (and optionally sulfur) obtained by dissolution in hydrazine without the requirement for post-deposition, high-temperature selenization.[1-3] Subsequently, a hydrazine-free approach was reported whereby isolated hydrazinium-based precursors could be deposited to form metal chalcogenide composite films.[4] More recently, Mitzi et al. described a 15.2% PCE for a thin-film solar cell with a solution-processed $Cu(In,Ga)(S,Se)_2$ (CIGS) absorber, which represents the highest reported value for a pure solution deposition method.[5] With the exception of the aforementioned cases, solution-based deposition methods for fabricating a CIGS absorber layer have historically provided significantly lower performance relative to vacuum and electrodeposition processes.

Keszler et al. described a solution-based approach for the synthesis of low contamination metal chalcogenides in aqueous media.[6] In this case, the formulations consist of aqueous solutions of metal chalcogenide precursors as a mixture of metal cation salts, formate anions and a source of chalcogenide (selenium, sulfur) in the form of thermally labile precursors including thiourea, thioformamide, selenourea, selenoformamide, etc. Overall, this method offers both environmentally favorable processing and low CIGS film contamination due to the careful selection of appropriate precursor materials. Finally, Wang et al. reported an inkjet printing method whereby the CIGS absorber layer was printed on molybdenum (Mo)-coated substrates from a solution of Cu, In, and Ga materials containing ethylene glycol and ethanolamine.[7] Following selenization and CIGS device integration, an overall PCE of 5.04% was obtained. Subsequently, Wang et al. demonstrated CIGS solar cell performance exceeding 8% through careful optimization of Cu, In and Ga precursor formulations.[8] As previously mentioned, solution processing methods for CIGS generally suffer from lower performance relative to conventional vacuum (and/or electrodeposition) approaches, with the exception of the hydrazine-based method. In response to this, appropriate impurity doping strategies offer the potential to dramatically improve the morphology and PV behavior of the CIGS absorber composite, thereby decreasing the performance "gap" between solution and vacuum processes for CIGS. Fortunately, CIGS exhibits a robust tolerance towards defects and/or impurities. In light of this, benefits from impurity doping have been successfully exploited through improvements in CIGS layer morphology that ultimately translate into better device performance primarily through a reduction of grain boundaries, which suppresses recombination phenomena. Yuan et al. provided CIGS solar cells with the incorporation of antimony (Sb) into a hydrazine-based method.[9] Through this strategy using a 1.2 mol % Sb doping level, PCEs of 10.5% and 8.4% were achieved for CIGS solar cells processed at 400° C. and 360° C., respectively.[10] A parallel study described an optimized method for Sb doping in a hydrazine-based approach with Sb dopant levels in the 0.2-1.0 mol % range.[11] In this case, a PCE exceeding 12% for CIGS solar cells featuring Sb dopant was demonstrated. Unfortunately, the high toxicity and reactivity associated with hydrazine is a major disadvantage which may limit the practical adoption of these approaches in large-scale production environments.

Yatsushiro et al. investigated the impact of Sb inclusion on CIGS thin-films and solar cells.[12] In this case, an Sb layer (~10-50 nm) was initially deposited onto Mo-coated soda lime glass (SLG) and $SiO_x$-coated SLG. In the latter case, the $SiO_x$ film functioned as a barrier to Na diffusion from SLG in order to isolate the impact of Sb on CIGS performance. Next, CIGS thin films were deposited on top through a three-stage process using molecular beam epitaxy (MBE). Overall, an enhancement in CIGS grain growth was observed for Sb-doped CIGS when SLG substrates were used although not similarly in the case when an alkali diffusion barrier on SLG was employed, leading the authors to assert that the beneficial doping of CIGS with Sb is limited to those scenarios where Na is also present in the CIGS layers.

In contrast to solution-based approaches for CIGS fabrication, Aksu et al. described a method for electrodeposition of a group VA metal including antimony (Sb), arsenic (As) and bismuth (Bi) into an electroplated metal composite, which is applicable to the fabrication of absorber materials (CIGS, for example).[13] Specific aspects of the technology include an electroplating solution for deposition of a thin film that includes a Group VA material and a method of electroplating for depositing a thin film that includes a Group VA material.

1. D. B. Mitzi, M. Yuan, W. Liu, A. J. Kellock, S. J. Chey, V. Deline and A. G. Schrott, "A High-Efficiency Solution-Deposited Thin-Film Photovoltaic Device", *Advanced Materials* 2008, 20, 3657-3662.
2. D. B. Mitzi, M. Yuan, W. Liu, A. J. Kellock, S. J. Chey, L. Gignac and A. G. Schrott, "Hydrazine-Based Deposition Route for Device-Quality CIGS Films", *Thin Solid Films* 2009, 517, 2158-2162.
3. D. B. Mitzi, W. Liu and M. Yuan, "Photovoltaic Device with Solution-Processed Chalcogenide Absorber Layer", US2009/0145482 A1.
4. D. B. Mitzi and M. W. Copel, "Hydrazine-Free Solution Deposition of Chalcogenide Films", U.S. Pat. No. 8,134,150 B2.
5. T. K. Todorov, O. Gunawan, T. Gokmen and D. B. Mitzi, "Solution-Processed Cu(In,Ga)(S,Se)$_2$ Absorber Yielding a 15.2% Efficient Solar Cell", *Progress in Photovoltaics: Research and Applications* 2012, doi:10.1002/pip.1253.
6. D. A. Keszler and B. L. Clark, "Metal Chalcogenide Aqueous Precursors and Processes to Form Metal Chalcogenide Films", US2011/0206599 A1.
7. W. Wang, Y-W. Su and C-H. Chang, "Inkjet Printed Chalcopyrite CuIn$_x$Ga$_{1-x}$Se$_2$ Thin Film Solar Cells", *Solar Energy Materials & Solar Cells* 2011, 95, 2616-2620.
8. W. Wang, S-Y. Han, S-J. Sung, D-H. Kim and C-H. Chang, "8.01% CuInGaSe$_2$ Solar Cells Fabricated by Air-Stable Low-Cost Inks", *Physical Chemistry Chemical Physics* 2012, 14, 11154-11159.
9. M. Yuan, D. B. Mitzi and W. Liu, "Techniques for Enhancing Performance of Photovoltaic Devices", US2009/0320916 A1.
10. M. Yuan, D. B. Mitzi, O. Gunawan, A. J. Kellock, S. J. Chey and V. R. Deline, "Antimony Assisted Low-Temperature Processing of CuIn$_{1-x}$Ga$_x$Se$_{2-y}$S$_y$ Solar Cells", *Thin Solid Films* 2010, 519, 852-856.
11. M. Yuan, D. B. Mitzi, W. Liu, A. J. Kellock, S. J. Chey, V. R. Deline, "Optimization of CIGS-Based PV Device Through Antimony Doping", *Chemistry of Materials* 2010, 22, 285-287.
12. Y. Yatsushiro, H. Nakakoba, T. Mise, T. Kobayashi and T. Nakada, "Effects of Antimony Doping on Cu(In$_{1-x}$,Ga$_x$)Se$_2$ Thin Films and Solar Cells", *Japanese Journal of Applied Physics* 2012, 51, 10NC25-1 to 10NC25-4.
13. S. Aksu, S. Lastella and M. Pinarbasi, "Electrodepositing Doped CIGS Thin Films for Photovoltaic Devices", US20120214293.

It would be advantageous if a solution-based process existed for the fabrication of a Group VA-doped metal chalcogenide, such as an antimony-doped Cu—In—Ga—Se (CIGS) composite material.

SUMMARY OF THE INVENTION

Described herein is a solution process strategy for fabricating an antimony (Sb)-doped CIGS absorber layer using soluble sources of copper (Cu), indium (In), gallium (Ga), and Sb deposited in the form of a precursor solution. Conveniently, the precursor formulation and subsequent deposition processes can be performed using conventional methodologies without the need for strict environmental control.

As mentioned the Background Section above, solution-processed approaches to CIGS absorber layer fabrication have historically demonstrated lower performances relative to vacuum and electrodeposition methods. However, hydrazine based approaches for solution processed CIGS have successfully provided efficiencies ~15%. Unfortunately, the hazards associated with hydrazine may limit the practical application of such approaches in manufacturing capacities. As an alternative to hydrazine, the method disclosed herein incorporates Sb as dopant in CIGS using a solution based approach, whereby an intermediate (presumably oxide) film of Cu, In, Ga, and Sb is formed following deposition and thermal anneal of individual layers. The approach takes advantage of low-boiling solvents and weakly coordinating ligands that are removed during thermal processing. As an alternative to hydrazine-based solvent systems, the solvents used may include low boiling alcohols, such as methanol, ethanol, etc., and/or acids, such as acetic acid, for dissolving the precursor metal salts, metal complexes, and combinations thereof.

Subsequent high temperature selenization of the Cu—In—Ga—Sb precursor film with Se powder in an H$_2$ environment affords Sb-doped CIGS. The beneficial impact of Sb-doping in CIGS is obvious through improved PV performance with respect to short circuit current ($J_{sc}$), open circuit voltage ($V_{oc}$), fill factor (FF), and overall device efficiency ($\eta$). Furthermore, the impact of Sb doping on CIGS manifests itself in terms of improved CIGS morphology as confirmed by scanning electron microscope (SEM) cross-sectional analysis versus control CIGS absorber composites (no Sb), which is consistent with assertions provided in the prior art.

Accordingly, a method is provided for forming a Group VA-doped solution-processed metal chalcogenide. The method forms a first solution including a first material group that may be metal salts, metal complexes, and combinations thereof, dissolved in a solvent. A Group VA-containing material is added to the first solution. The Group VA-containing material may include arsenic (As), antimony (Sb), bismuth (Bi), or combinations thereof. The first solution is deposited on a conductive substrate, and a Group VA-doped first intermediate film is formed comprising metal precursors from corresponding members of the first material group. A thermal annealing is performed in an environment of selenium (Se), Se and hydrogen (H$_2$), hydrogen selenide (H$_2$Se), sulfur (S), S and H$_2$, hydrogen sulfide (H$_2$S), or combinations thereof. As a result, the metal precursors in the Group VA-doped first intermediate film are transformed, forming a Group VA-doped metal chalcogenide layer.

Some examples of first material group members include aluminum (Al), antimony (Sb), arsenic (As), bismuth (Bi), cadmium (Cd), chromium (Cr), cobalt (Co), copper (Cu), gallium (Ga), germanium (Ge), gold (Au), indium (In), iridium (Ir), iron (Fe), lead (Pb), manganese (Mn), mercury (Hg), molybdenum (Mo), nickel (Ni), niobium (Nb), osmium (Os), palladium (Pd), platinum (Pt), rhodium (Rh), ruthenium (Ru), silver (Ag), tantalum (Ta), tin (Sn), titanium (Ti), tungsten (W), vanadium (V), zinc (Zn), zirconium (Zr), and combinations thereof. In one aspect, an antimony-containing material is added to a first solution, where the first material group includes Cu, In, and Ga. After thermally annealing in an environment of Se, Se and $H_2$, $H_2Se$, or combinations of the above-mentioned materials, an antimony-doped Cu—In—Ga—Se chalcogenide (CIGS) is formed.

Additional details of the above-described methods are provided below.

DETAILED DESCRIPTION

Figure 1:
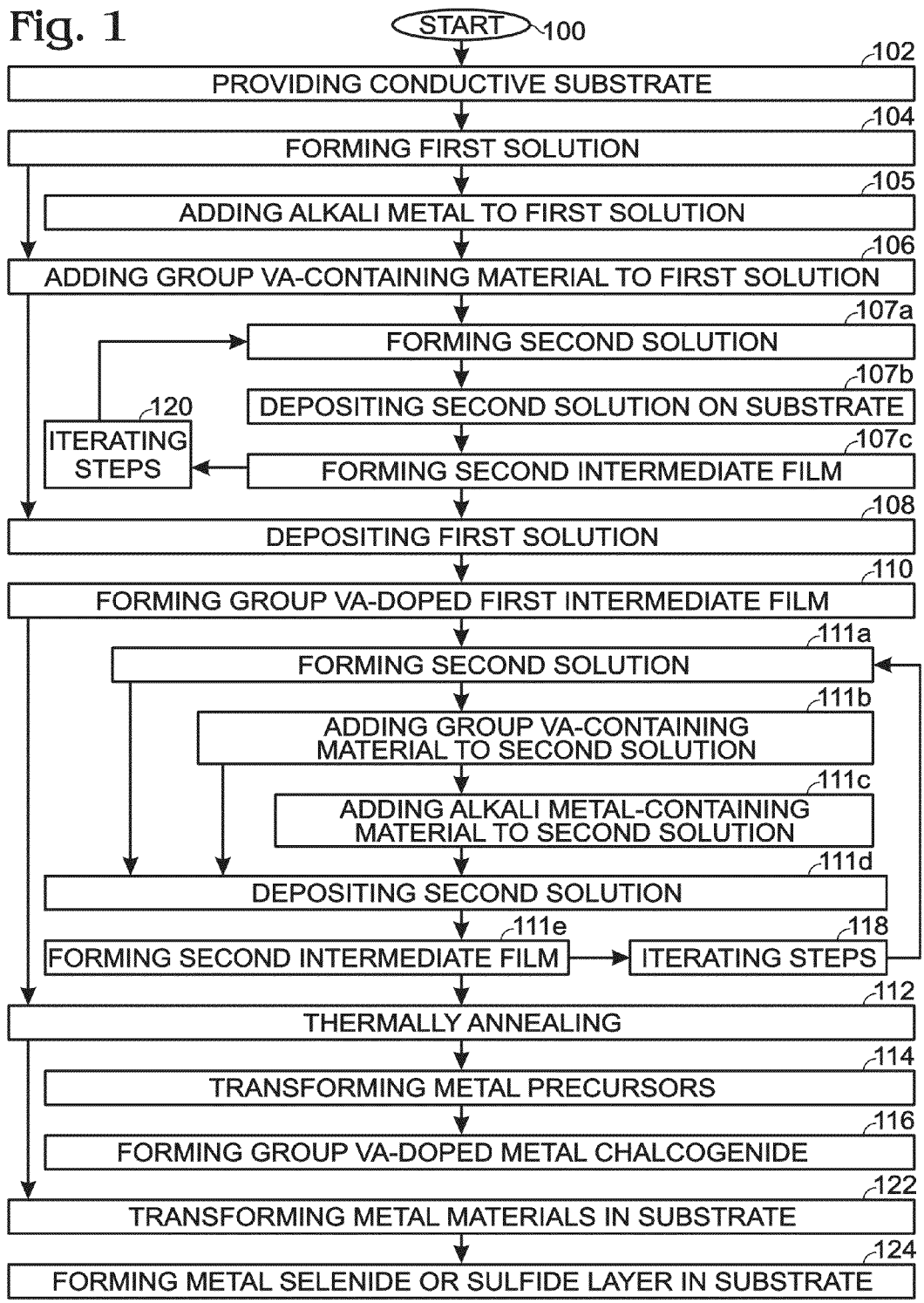
FIG. 1 is a flowchart illustrating a method for forming a Group VA-doped solution-processed metal chalcogenide.

FIG. 1 is a flowchart illustrating a method for forming a Group VA-doped solution-processed metal chalcogenide. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method begins at Step 100.

Step 102 provides a conductive substrate. The conductive substrate may be a metal, metal alloy, metal oxide, mixed metal oxide, or a combination thereof. Some examples of conductive substrate materials include aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, fluorine-doped tin oxide, and combinations thereof. Step 104 forms a first solution including a first material group of metal salts, metal complexes, and combinations thereof, dissolved in a solvent. As used herein, a solvent is a mixture of chemicals used to affect dissolution of the metal precursors. More generally, the solvents that make up the majority of the solution (liquid phase) to dissolve the metal precursors often include smaller quantities of functional "additives". These additives may be required to facilitate dissolution of the metal precursors. Furthermore, these additives may be classified as solvents as well. For example, the solvents may include low boiling alcohols, such as methanol, ethanol, etc., and/or acids, such as acetic acid, for dissolving the precursor metal salts, metal complexes, and combinations thereof.

The first material group is selected from a first material set. Some examples of first material set materials include aluminum (Al), antimony (Sb), arsenic (As), bismuth (Bi), cadmium (Cd), chromium (Cr), cobalt (Co), copper (Cu), gallium (Ga), germanium (Ge), gold (Au), indium (In), iridium (Ir), iron (Fe), lead (Pb), manganese (Mn), mercury (Hg), molybdenum (Mo), nickel (Ni), niobium (Nb), osmium (Os), palladium (Pd), platinum (Pt), rhodium (Rh), ruthenium (Ru), silver (Ag), tantalum (Ta), tin (Sn), titanium (Ti), tungsten (W), vanadium (V), zinc (Zn), zirconium (Zr), and combinations thereof.

Step 106 adds a Group VA-containing material to the first solution, where the Group VA-containing material is As, Sb, Bi, or combinations thereof. Alternatively stated, Step 106 adds a Periodic Table Group VA material that is classified as either a metal or "metalloid".

Step 108 deposits the first solution on the conductive substrate. Step 110 forms a Group VA-doped first intermediate film comprising metal precursors from corresponding members of the first material group. Typically, a first proportion of the Group VA-doped first intermediate film is a metal oxide or mixed metal oxide. As used herein, the term "intermediate film" refers to a film formed as a result of depositing a solution of dissolved metals salts, metal complexes, and combinations thereof (from a solvent), followed by thermal treatment to remove at least a percentage of solvent and furnish a metal-containing precursor film, whereby some first proportion of the film may be metal oxide or mixed-metal oxide.

Step 112 thermally anneals in an environment of selenium (Se), Se and hydrogen ($H_2$), hydrogen selenide ($H_2Se$), sulfur (S), S and $H_2$, hydrogen sulfide ($H_2S$), or combinations thereof. As a result, Step 114 transforms the metal precursors in the Group VA-doped first intermediate film, and Step 116 forms a Group VA-doped metal chalcogenide layer. In one particular example, the first material group of Step 104 includes Cu, In, and Ga, and Step 112 thermally anneals in an environment of Se, Se and $H_2$, or $H_2Se$. As a result, Step 116 forms a Group VA-doped Cu—In—Ga—Se chalcogenide (CIGS).

A "metal chalcogenide" is defined herein as a composite material including one or more metals from the first material set, and either Se, S, or both. A doping level for Group VA metals or metalloids corresponding to 0.001-1.0%, relative to total metal content in the resulting metal chalcogenide, is typically employed although higher or lower levels are possible. As described above, As, Sb, and Bi may be either dopants (Step 106) or members of the first material set (Step 104). As used herein, dopant or dopants include those materials that are incorporated at significantly lower molar ratios relative to the metals comprising the metal or mixed-metal chalcogenide composition. Typically, a dopant is employed in small concentrations (<5 mol %), which are calculated relative to the combined molar composition of metals employed from the first material group. In light of this, it is possible to provide a Group VA chalcogenide that is doped with a non-identical Group VA material, wherein the percentage of incorporated Group VA (as dopant) represents a minority amount.

As noted above, thermal annealing in the provided atmosphere transforms the intermediate film from metal/mixed-metal precursor (e.g., oxide) to metal/mixed metal chalcogenide. During the thermal process, Se or S reacts with the metal precursors (intermediate film or films). Typically, this annealing stage proceeds at high temperatures (e.g., greater than 400° C.) and is an important step in furnishing the resultant Group VA-doped metal chalcogenide. However, following the deposition of the metal precursor solutions to form the intermediate films, a lower temperature thermal process may be employed to furnish the intermediate film, as well as to evaporate solvents. In the interests of simplicity, these lower temperature annealing steps are not explicitly mentioned in the methods described by FIGS. 1 and 2.

In one aspect, Step 105 adds an alkali metal-containing material, such as lithium (Li), sodium (Na), potassium (K), cesium (Cs), or combinations thereof, to the first solution. Note: Step 105 may optionally be performed after Step 106.

Then, forming the Group VA-doped first intermediate film in Step 110 includes forming a combination Group VA and alkali metal-doped first intermediate layer, and forming the Group VA-doped metal chalcogenide in Step 116 includes forming a combination Group VA and alkali-doped metal chalcogenide.

In one aspect, prior to thermal annealing in Step 112, Step 111a forms a second solution including a second material group using materials listed above from the first material set, dissolved in a solvent. Step 111d deposits the second solution on the Group VA-doped first intermediate film. Step 111e forms a second intermediate film comprising metal precursors from corresponding members of the second material group. Then, Step 114 additionally transforms metal precursors in the second intermediate film.

In one variation, prior to depositing the second solution on the Group VA-doped first intermediate film in Step 111d, Step 111b adds a Group VA-containing material, such as As, Sb, Bi, or combinations thereof, to the second solution. Then, Step 111e forms a Group VA-doped second intermediate film, and Step 114 transforms metal precursors in the Group VA-doped second intermediate film.

In another variation, Step 111c adds an alkali metal-containing material, such as Li, Na, K, Cs, or combinations thereof, to the second solution. Then, Step 111e forms a combination Group VA and alkali metal-doped second intermediate layer, and Step 116 forms a combination Group VA and alkali-doped metal chalcogenide. Note: Step 111c may optionally be performed before Step 111b.

As represented by reference designator 118, Steps 111a, 111d, and 111e may be iteratively performed, to form a plurality of intermediate films overlying the Group VA-doped first intermediate film. Alternatively, Step 111a, 111b, 111d, and 111e may be iteratively performed, to form a plurality of Group VA-doped intermediate films overlying the Group VA-doped first intermediate film. In another variation, Steps 111a, 111b, 111c, 111d, and 111e may be iteratively performed. In one variation, a combination of the above-mentioned intermediate films can be sequentially or non-sequentially deposited.

In another aspect prior to depositing the first solution in Step 108, Step 107a forms a second solution including a second material group using materials listed above from the first material set, dissolved in a solvent. Step 107b deposits the second solution overlying and in direct contact with the conductive substrate. Step 107c forms a second intermediate film comprising metal precursors from corresponding members of the second material group. Then, forming the Group VA-doped first intermediate film in Step 110 includes forming the Group VA-doped first intermediate film overlying and in direct contact with the second intermediate film, and Step 114 additionally transforms metal precursors in the second intermediate film. As represented by reference designator 120, Steps 107a through 107c may be iteratively repeated a plurality of times to form a plurality of second intermediate films.

In one aspect as a result of thermally annealing in Step 112, Step 122 transforms at least some proportion of metal-containing materials in the conductive substrate. Step 124 forms a layer in the conductive substrate of either metal selenide or metal sulfide, underlying the Group VA-doped metal chalcogenide layer, depending on the environment of Step 112.

Figure 2:
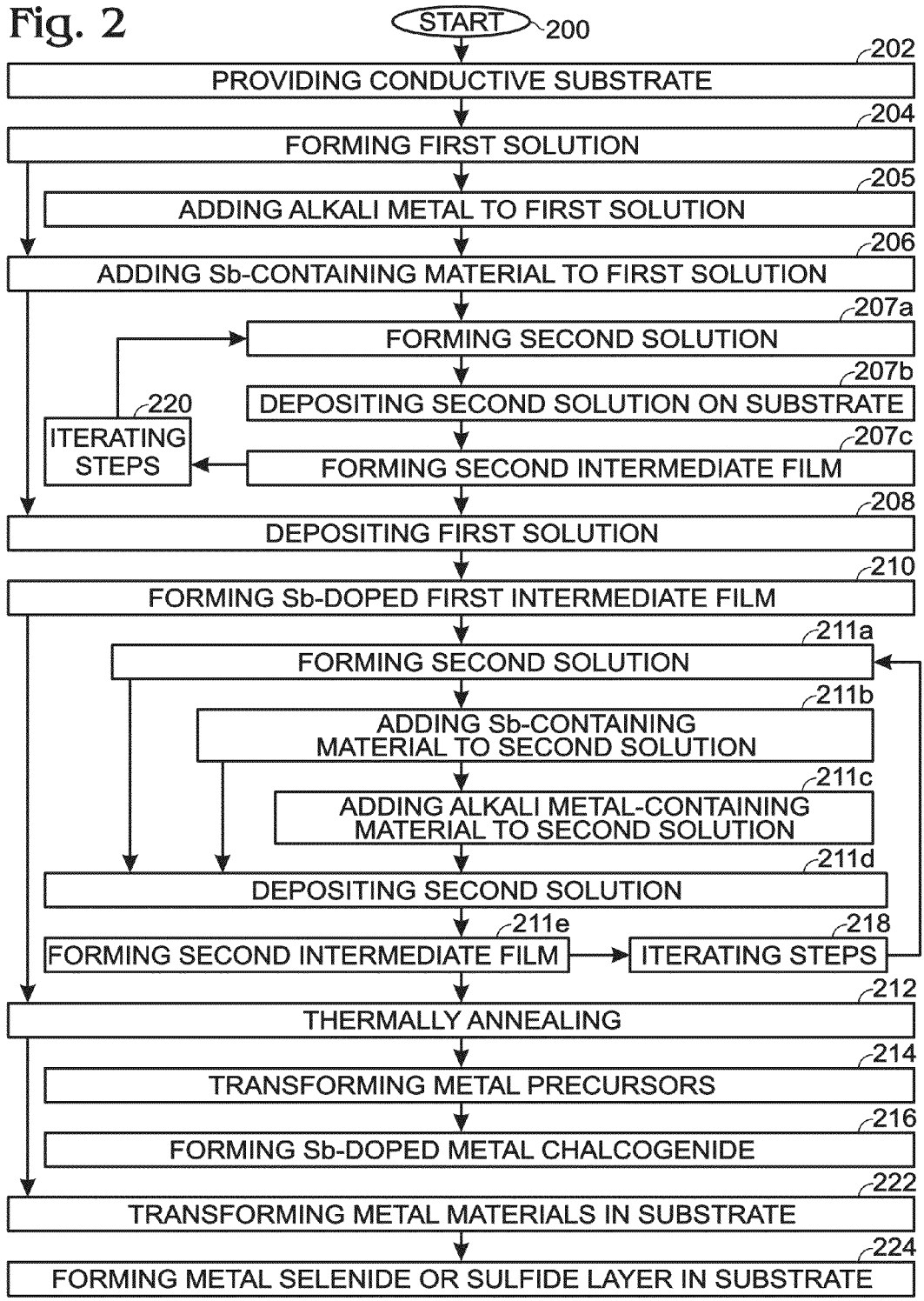
FIG. 2 is a flowchart illustrating a method for forming an antimony (Sb)-doped solution-processed metal chalcogenide.

FIG. 2 is a flowchart illustrating a method for forming an antimony (Sb)-doped solution-processed metal chalcogenide. The method begins at Step 200. Step 202 provides a conductive substrate. The conductive substrate may be a metal, metal alloy, metal oxide, mixed metal oxide, or a combination thereof. Some examples of conductive substrate materials include aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, fluorine-doped tin oxide, and combinations thereof.

Step 204 forms a first solution including a first material group of metal salts, metal complexes, or combinations thereof, dissolved in a solvent. The first material group is chosen from a first material set. Some examples of the first material set include Cu, In, Ga, and combinations thereof. Step 206 adds an antimony-containing material to the first solution. Step 208 deposits the first solution on the conductive substrate. Step 210 forms an antimony-doped first intermediate film comprising metal precursors from corresponding members of the first material group. Step 212 thermally anneals in an environment of Se, Se and $H_2$, $H_2Se$, S, S and $H_2$, $H_2S$, and combinations thereof. The meaning of the terms "solvent", "intermediate film", "dopant", and "thermally anneal" has been presented above in the discussion of FIG. 1.

As a result, Step 214 transforms the metal precursors in the antimony-doped first intermediate film, and Step 216 forms an antimony-doped metal chalcogenide layer. In one aspect, Step 212 thermally anneals in an environment of Se, Se and $H_2$, $H_2Se$, or combinations thereof, and Step 216 forms an antimony-doped Cu—In—Ga—Se chalcogenide (CIGS).

In another aspect, Step 205 adds an alkali metal-containing material, such as Li, Na, K, Cs, or combinations thereof, to the first solution. Then, Step 210 forms a combination antimony and alkali metal-doped first intermediate layer, and Step 216 forms a combination of antimony and alkali-doped metal chalcogenide. Note: Step 205 may be performed after Step 206.

In one aspect prior to thermal annealing in Step 212, Step 211a forms a second solution including a second material group using materials listed above from the first material set, dissolved in a solvent. Step 211d deposits the second solution on the antimony-doped first intermediate film. Step 211e forms a second intermediate film comprising metal precursors from corresponding members of the second material group. Then, transforming the metal precursors in the antimony-doped first intermediate film in Step 214 additionally includes transforming metal precursors in the second intermediate film.

In one variation prior to depositing the second solution on the antimony-doped first intermediate film in Step 211d, Step 211b adds an antimony-containing material to the second solution. Then, Step 211e forms an antimony-doped second intermediate film, and Step 214 transforms metal precursors in the antimony-doped second intermediate film. In another variation, Step 211c adds an alkali metal-containing material, such as Li, Na, K, Cs, or combinations thereof, to the second solution. Then, Step 211e forms a combination of antimony and alkali-doped second intermediate layer, and Step 216 forms a combination antimony and alkali-doped metal chalcogenide. Optionally, Step 211c may be performed before Step 211b.

As represented by reference designator 218, Steps 211a, 211d, and 211e may be iteratively performed, to form a plurality of intermediate films overlying the antimony-doped first intermediate film. Alternatively, Step 211a, 211b, 211d, and 211e may be iteratively performed, to form a plurality of antimony-doped intermediate films overlying the antimony-doped first intermediate film. In another variation, Steps 211a, 211b, 211c, 211d, and 211e may be iteratively performed. In one variation, a combination of the above-mentioned intermediate films can be sequentially or non-sequentially deposited.

In one aspect prior to depositing the first solution in Step 208, Step 207a forms a second solution including a second material group using materials listed above from the first material set, dissolved in a solvent. Step 207b deposits the second solution overlying and in direct contact with the conductive substrate. Step 207c forms a second intermediate film comprising metal precursors from corresponding members of the second material group. Then, forming the antimony-doped first intermediate film in Step 210 includes forming the antimony-doped first intermediate film overlying and in direct contact with the second intermediate film. Step 214 additionally transforms metal precursors in the second intermediate film. As represented by reference designator 220, Steps 207a through 207c may be iteratively repeated a plurality of times.

In one aspect as a result of thermally annealing in Step 212, Step 222 transforms at least some proportion of metal-containing materials in the conductive substrate. Step 224 forms a layer in the conductive substrate of either metal selenide or metal sulfide (depending on the environment of Step 212), underlying the antimony-doped metal chalcogenide layer.
Experimental Data:

For solution-processed CIGS doping with Sb, moderate levels of Sb were employed for the purposes of improving absorber layer morphology while minimizing the potentially negative impact of Sb inclusion on CIGS composition. In general, homogenous solutions of metal salts, metal complexes, and combinations thereof in appropriate ratios, either with or without a soluble Sb-containing material, were employed. For the investigation of Sb-doping in solution-processed CIGS, a doping level corresponding to 0.29 mol % Sb (relative to combined moles of Cu, In and Ga precursor sources) was used. The CIGS solar cells so fabricated were directly compared with control devices fabricated in an identical manner with the exception of Sb exclusion.
Cu—In—Ga (or Cu—In—Ga—Na) Ink Deposition:

Metal (precursor) solutions consisting of Cu, In, Ga, and optionally Sb, were deposited on molybdenum [Mo/Glass] substrates by sequential spin-coating, followed by brief thermal treatment. The glass chosen was strategically employed in an effort to exclude the possibility of sodium (Na)-doping from soda lime glass (SLG). The spin-coating/anneal cycles were carried out using formulations as indicated below. Of course, other suitable methods for deposition of the precursor solution can be applied including doctor-blading, drop-casting, or inkjet printing, among others.

Substrate 23-5: Cu—In—Ga (no Sb)
Substrate 23-8: Cu—In—Ga (containing 0.29 mol % Sb)
CIGS Solar Cell Processing & Integration:

Selenization of the as-deposited Cu—In—Ga (and Cu—In—Ga—Sb) precursor films was performed with selenium (Se) powder in $H_2$ atmosphere. Subsequently, a thin cadmium sulfide (CdS) film was deposited via chemical bath deposition (CBD).

Next, zinc oxide (ZnO) and indium tin oxide (ITO) were sequentially deposited by a vacuum process. Aluminum (Al) contacts were deposited by e-beam evaporation. Finally, mechanical scribing down to Mo layer was used to isolate individual devices. Indium was mechanically pressed on an exposed portion of Mo film along one side of the device array as contact.
CIGS Solar Cell Performance: Impact of Sb Doping As mentioned above, CIGS solar cells were fabricated for the purposes of determining the impact of Sb doping on CIGS absorber layer morphology and overall solar cell performance. A comparison is provided for CIGS solar cells fabricated either with Sb (0.29 mol %, Device 23-8-1 to 23-8-8) or without Sb (control, Device 23-5-1 to 23-5-8). In each case, eight individual CIGS devices are presented for both the Sb-doped the undoped (control) devices.

Figure 3:
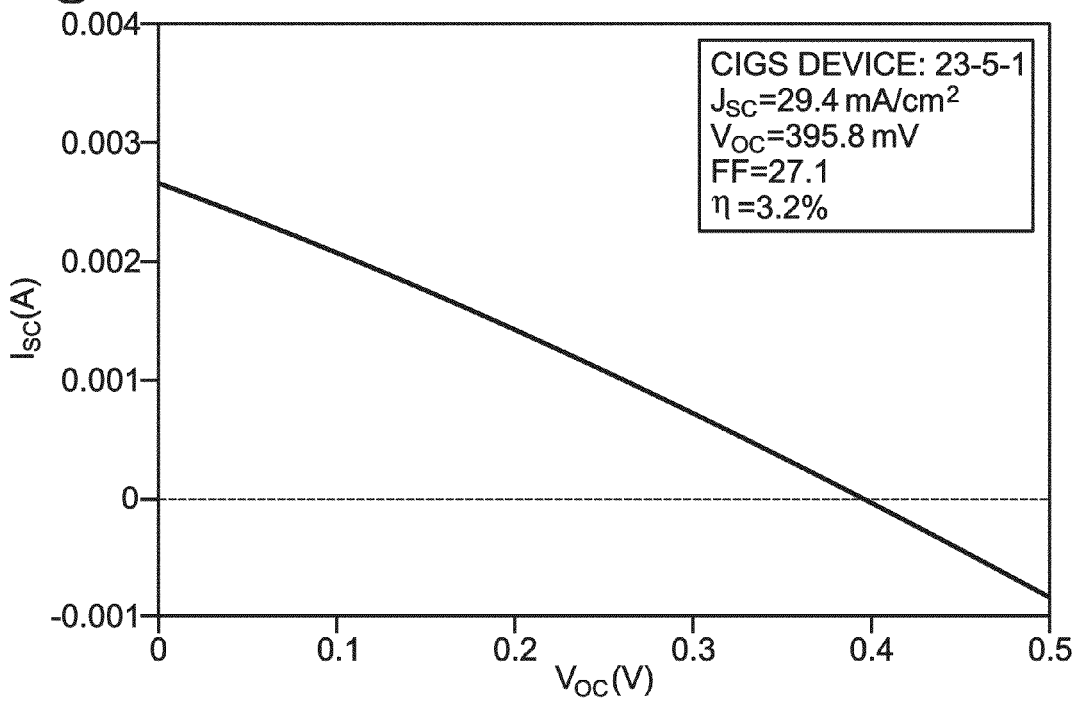
FIG. 3 is a graph depicting a current-voltage (I-V) curve for control CIGS solar cell 23-5-1 (no Sb).

FIG. 3 is a graph depicting a current-voltage (I-V) curve for control CIGS solar cell 23-5-1 (no Sb). [y-axis: $I_{sc}$ (A); x-axis: $V_{oc}$ (V)]. The I-V curve presents the highest performing control CIGS solar cell. Overall, the control CIGS device exhibits short circuit current ($J_{sc}$)=29.4 mA/cm$^2$, open circuit voltage ($V_{oc}$)=395.8 mV, fill factor (FF)=27.1, and efficiency ($\eta$)=3.2%. A summary of PV performance values ($J_{sc}$, $V_{oc}$, FF, and $\eta$) for eight CIGS solar cells (23-5-1 to 23-5-8, control, no Sb) is provided in Table 1.

TABLE 1

Summary of photovoltaic characteristics for CIGS solar cells 23-5-1 to 23-5-8: short-circuit current density ($J_{sc}$), open-circuit voltage ($V_{oc}$), fill factor (FF), and efficiency ($\eta$).

| Device ID | $J_{sc}$ (mA/cm$^2$) | $V_{oc}$ (mV) | FF | $\eta$ (%) |
|---|---|---|---|---|
| 23-5-1 | 29.4 | 395.8 | 27.1 | 3.2 |
| 23-5-2 | 25.9 | 398.9 | 27.8 | 2.9 |
| 23-5-3 | 28.8 | 355.6 | 27.0 | 2.8 |
| 23-5-4 | 18.6 | 401.9 | 34.3 | 2.6 |
| 23-5-5 | 20.8 | 385.3 | 30.7 | 2.5 |
| 23-5-6 | 25.4 | 339.5 | 27.8 | 2.4 |
| 23-5-7 | 23.3 | 351.0 | 26.8 | 2.2 |
| 23-5-8 | 18.3 | 413.4 | 29.2 | 2.2 |
| Average Value | 23.8 (mA/cm$^2$) | 380.1 (mV) | 28.8 | 2.6% |

Figure 4:
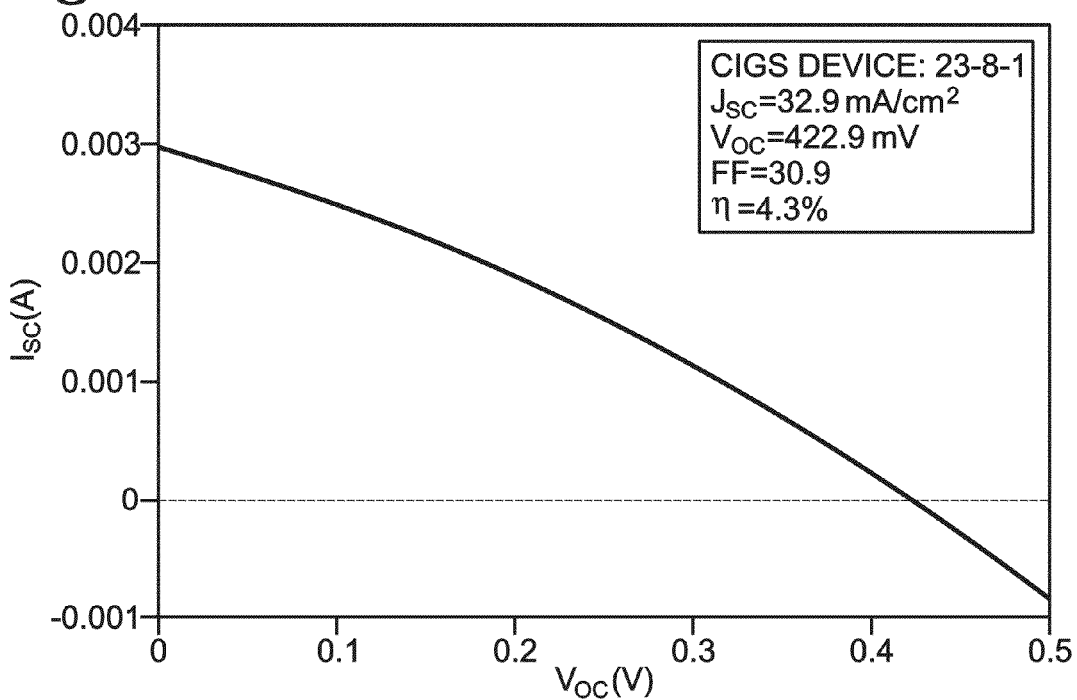
FIG. 4 is a graph depicting an I-V curve for a Sb-doped CIGS solar cell 23-8-1 (0.29 mol % Sb).

FIG. 4 is a graph depicting an I-V curve for a Sb-doped CIGS solar cell 23-8-1 (0.29 mol % Sb). [y-axis: $I_{sc}$ (A); x-axis: $V_{oc}$ (V)]. The I-V curve presents the highest performing Sb-doped CIGS solar cell. The Sb-doped CIGS device exhibits $J_{sc}$=32.9 mA/cm$^2$, $V_{oc}$=422.9 mV, FF=30.9, and $\eta$=4.3%. A summary of PV performance values ($J_{sc}$, $V_{oc}$, FF, and $\eta$) for eight Sb-doped CIGS solar cells (23-8-1 to 23-8-8, 0.29 mol % Sb) is provided in Table 2.

TABLE 2

Summary of photovoltaic characteristics for Sb-doped CIGS solar cells 23-8-1 to 23-8-8: short-circuit current density ($J_{sc}$), open-circuit voltage ($V_{oc}$), fill factor (FF), and efficiency ($\eta$).

| Device ID | $J_{sc}$ (mA/cm$^2$) | $V_{oc}$ (mV) | FF | $\eta$ (%) |
|---|---|---|---|---|
| 23-8-1 | 32.9 | 422.9 | 30.9 | 4.3 |
| 23-8-2 | 30.6 | 412.2 | 30.6 | 3.9 |
| 23-8-3 | 32.9 | 398.8 | 29.6 | 3.9 |
| 23-8-4 | 30.9 | 398.5 | 31.2 | 3.8 |
| 23-8-5 | 31.6 | 398.0 | 28.4 | 3.6 |
| 23-8-6 | 30.5 | 387.9 | 29.7 | 3.5 |
| 23-8-7 | 27.6 | 399.4 | 30.2 | 3.3 |
| 23-8-8 | 23.0 | 435.6 | 32.5 | 3.3 |
| Average Value | 30.0 (mA/cm$^2$) | 406.7 (mV) | 30.4 | 3.7% |

Figure 5A:
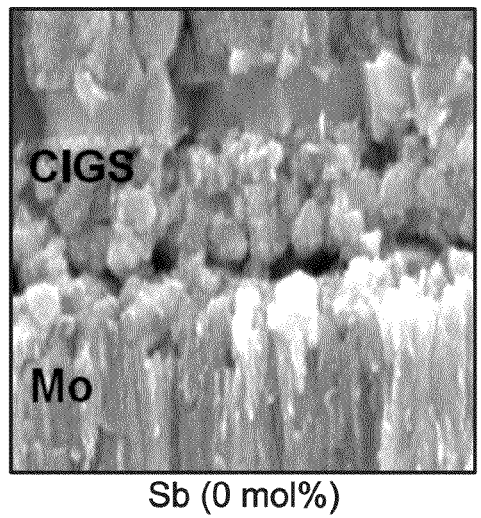
FIGS. 5A through 5C show representative SEM cross-sectional images for CIGS devices containing Sb at doping levels corresponding to 0 mol % (control), 0.29 mol %, and 1 mol %, respectively.
Figure 5B:
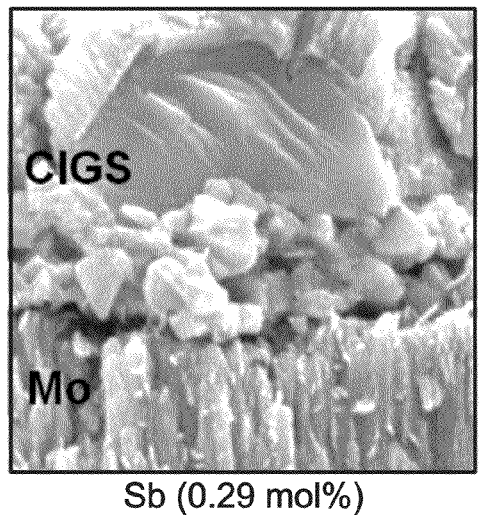
Figure 5C:
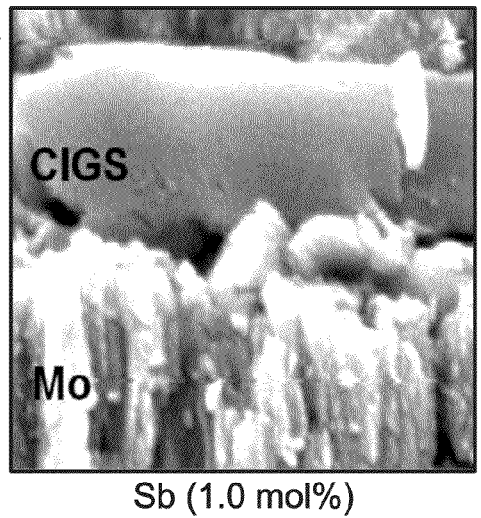

FIGS. 5A through 5C show representative SEM cross-sectional images for CIGS devices containing Sb at doping levels corresponding to 0 mol % (control), 0.29 mol %, and 1 mol %, respectively. As can be seen in the figures, significant improvements in CIGS grain size/morphology is achieved with increasing Sb-doping levels. Although the largest CIGS grains were obtained in the case of 1 mol % Sb content, lower overall PV performance (data not shown) was observed relative to control devices (no Sb), which suggests that high levels of Sb doping exert a negative impact on absorber layer performance. In light of this, it can be asserted that Sb-doping at the appropriate level is important for balancing the positive impact on CIGS morphology with negative influences due to excessive doping.

Finally, a comparative summary of average PV performance metrics for control (23-5-1 to 23-5-8) and Sb-doped CIGS solar cells (23-8-1 to 23-8-8, 0.29 mol % Sb) is provided in Table 3. All fabrication and device integration processes for the control and Sb-doped CIGS devices were maintained as identical and, furthermore, both sets of devices were prepared from the same batch of substrates. Overall, percent increases for individual parameters—$J_{sc}$, $V_{oc}$, FF, and η corresponding to 26%, 7%, 6%, and 42%, respectively, were observed for Sb-doped CIGS (0.29% Sb) relative to control (0 mol % Sb).

TABLE 3

Summary of average photovoltaic characteristics for CIGS solar cells 23-5-1 to 23-5-8 (control) and 23-8-1 to 23-8-8 (0.29 mol % Sb) along with percent increases for individual PV performance metrics for Sb-doped CIGS solar cells relative to control devices (no Sb): short-circuit current density ($J_{sc}$), open-circuit voltage ($V_{oc}$), fill factor (FF), and efficiency (η).

| Device ID → PV Parameters ↓ | 23-5-1 to 23-5-8 (0 mol % Sb) | 23-8-1 to 23-8-8 (0.29 mol % Sb) | Percent Increase (%) (0 mol % Sb → 0.29 mol % Sb) |
|---|---|---|---|
| $J_{sc}$ | 23.8 mA/cm² | 30.0 mA/cm² | +26% |
| $V_{oc}$ | 380.1 mV | 406.7 mV | +7% |
| FF | 28.8 | 30.4 | +6% |
| η (%) | 2.6% | 3.7% | +42% |

A convenient solution-process method for antimony (Sb)-doped CIGS absorber layer fabrication has been demonstrated. Although Sb was employed for proof-of-concept CIGS solar cells, the method is amenable to doping with other Group VA elements including arsenic (As) and bismuth (Bi). This technology avoids highly toxic materials such as hydrazine, while all formulation, associated process, and device integration steps can be performed using conventional methods without the need for strict environment control. Low CIGS absorber layer contamination can be realized using low-boiling solvents and only weakly metal-coordinating additives that are effectively eliminated upon thermal processing. CIGS solar cells featuring an Sb-doped CIGS absorber layer demonstrated percent increases for individual PV parameters corresponding to 26% ($J_{sc}$), 7% ($V_{oc}$), 6% (FF), and 42% (η) relative to control devices (no Sb) based upon average values representing eight individual solar cells each for control and Sb-doped CIGS solar cells.

Processes have been provided for forming Group VA-doped metal chalcogenides using solution-processed metal precursors. Examples of materials and process variables have been presented to illustrate the invention. However, the invention is not limited to merely these examples. More explicitly, the processes described herein are not limited to just antimony dopants and CIGS. Other variations and embodiments of the invention will occur to those skilled in the art.

We claim:

1. A method for forming a Group VA-doped solution-processed metal chalcogenide, the method comprising:
providing a conductive substrate;
forming a first solution including a first material group selected from a first material set consisting of metal salts, metal complexes, and combinations thereof, dissolved in a solvent;
adding a Group VA-containing material to the first solution, where the Group VA-containing material is selected from a group consisting of arsenic (As), antimony (Sb), bismuth (Bi), and combinations thereof;
depositing the first solution on the conductive substrate;
forming a Group VA-doped first intermediate film comprising metal precursors from corresponding members of the first material group;
thermally annealing in an environment selected from a group consisting of selenium (Se), Se and hydrogen ($H_2$), hydrogen selenide ($H_2Se$), sulfur (S), S and $H_2$, hydrogen sulfide ($H_2S$), and combinations thereof;
as a result, transforming the metal precursors in the Group VA-doped first intermediate film; and,
forming a Group VA-doped metal chalcogenide layer comprising: adding an alkali metal-containing material, selected from a group consisting of lithium (Li), sodium (Na), potassium (K), cesium (Cs), and combinations thereof, to the first solution; wherein forming the Group VA-doped first intermediate film includes forming a combination Group VA and alkali metal-doped first intermediate layer; and, wherein forming the Group VA-doped metal chalcogenide includes forming a combination Group VA and alkali-doped metal chalcogenide, wherein forming the Group VA-doped first intermediate film comprising metal precursors includes forming a first proportion of the Group VA-doped first intermediate film with a material selected from a group consisting of metal oxides and mixed metal oxides.

2. The method of claim 1 wherein the first material set is selected from a group consisting of aluminum (Al), Sb, As, Bi, cadmium (Cd), chromium (Cr), cobalt (Co), copper (Cu), gallium (Ga), germanium (Ge), gold (Au), indium (In), iridium (Ir), iron (Fe), lead (Pb), manganese (Mn), mercury (Hg), molybdenum (Mo), nickel (Ni), niobium (Nb), osmium (Os), palladium (Pd), platinum (Pt), rhodium (Rh), ruthenium (Ru), silver (Ag), tantalum (Ta), tin (Sn), titanium (Ti), tungsten (W), vanadium (V), zinc (Zn), zirconium (Zr), and combinations thereof.

3. The method of claim 1 wherein the conductive substrate is selected from a class of materials consisting of metals, metal alloys, metal oxides, mixed metal oxides, and combinations thereof.

4. The method of claim 3 wherein the conductive substrate is selected from a group of materials consisting of aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, fluorine-doped tin oxide, and combinations thereof.

5. The method of claim 1 further comprising:
prior to thermal annealing, forming a second solution including a second material group selected from the first material set, dissolved in a solvent;
depositing the second solution on the Group VA-doped first intermediate film;
forming a second intermediate film comprising metal precursors from corresponding members of the second material group; and,
wherein transforming the metal precursors in the Group VA-doped first intermediate film additionally includes transforming metal precursors in the second intermediate film.

6. The method of claim 5 further comprising:
prior to depositing the second solution on the Group VA-doped first intermediate film, adding a Group VA-containing material, selected from the group consisting of As, Sb, Bi, and combinations thereof, to the second solution;
wherein forming the second intermediate film includes forming a Group VA-doped second intermediate film; and,
wherein transforming the metal precursors in the second intermediate film includes transforming metal precursors in the Group VA-doped second intermediate film.

7. The method of claim 6 further comprising:
adding an alkali metal-containing material, selected from a group consisting of Li, Na, K, Cs, and combinations thereof, to the second solution;
wherein forming the Group VA-doped second intermediate film includes forming a combination Group VA and alkali metal-doped second intermediate layer; and,
wherein forming the Group VA-doped metal chalcogenide includes forming a combination Group VA and alkali-doped metal chalcogenide.

8. The method of claim 1 further comprising:
prior to depositing the first solution, forming a second solution including a second material group selected from the first material set, dissolved in a solvent;
depositing the second solution overlying and in direct contact with the conductive substrate;
forming a second intermediate film comprising metal precursors from corresponding members of the second material group;
wherein forming the Group VA-doped first intermediate film includes forming the Group VA-doped first intermediate film overlying and in direct contact with the second intermediate film; and,
wherein transforming the metal precursors in the Group VA-doped first intermediate film additionally includes transforming metal precursors in the second intermediate film.

9. The method of claim 1 further comprising:
prior to thermally annealing, forming a plurality of intermediate films overlying the Group VA-doped first intermediate film.

10. The method of claim 1 further comprising:
prior to thermally annealing, forming a plurality of Group VA-doped intermediate films overlying the Group VA-doped first intermediate film.

11. The method of claim 1 further comprising:
as a result of thermally annealing, transforming at least some proportion of metal-containing materials in the conductive substrate; and,
forming a layer in the conductive substrate selected from a group consisting of a metal selenide and a metal sulfide, underlying the Group VA-doped metal chalcogenide layer.

12. The method of claim 1 wherein the first material group includes Cu, In, and Ga;
wherein thermally annealing includes thermally annealing in an environment selected from a group consisting of Se, Se and $H_2$, and $H_2Se$; and,
wherein forming the Group VA-doped metal chalcogenide includes forming a Group VA-doped Cu—In—Ga—Se chalcogenide (CIGS).

* * * * *